(12) United States Patent
Kaneko

(10) Patent No.: US 8,502,398 B2
(45) Date of Patent: Aug. 6, 2013

(54) WIRING BOARD, SEMICONDUCTOR APPARATUS AND METHOD OF MANUFACTURING THEM

(75) Inventor: Kentaro Kaneko, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 904 days.

(21) Appl. No.: 12/244,232

(22) Filed: Oct. 2, 2008

(65) Prior Publication Data

US 2009/0095514 A1 Apr. 16, 2009

(30) Foreign Application Priority Data

Oct. 5, 2007 (JP) ................................. 2007-262753

(51) Int. Cl.
*H01L 23/29* (2006.01)

(52) U.S. Cl.
USPC ............. 257/788; 257/E23.003; 257/E23.036

(58) Field of Classification Search
USPC ........... 257/778, E23.003, E23.036; 174/258
See application file for complete search history.

(56) References Cited

U.S. PATENT DOCUMENTS

| | | | |
|---|---|---|---|
| 2006/0121719 A1 | 6/2006 | Nakamura et al. | |
| 2007/0096327 A1* | 5/2007 | Kawamura et al. | 257/774 |
| 2008/0245549 A1* | 10/2008 | Kodani et al. | 174/126.1 |

FOREIGN PATENT DOCUMENTS

| | | |
|---|---|---|
| JP | 2000-323613 | 11/2000 |
| JP | 2002-076578 | 3/2002 |
| JP | 2003-297973 | 10/2003 |
| JP | 2004-006576 | 1/2004 |
| JP | 2004-319660 | 11/2004 |
| JP | 2005-244104 | 9/2005 |
| JP | 2006-093576 | 4/2006 |
| JP | 2006-186321 | 7/2006 |
| JP | 2006-332115 | 12/2006 |
| JP | 2007-13092 | 1/2007 |

OTHER PUBLICATIONS

Decision of Refusal (with English translation) issued in Japanese application No. 2008-259027 dated Sep. 25, 2012.

* cited by examiner

*Primary Examiner* — Daniel Whalen
(74) *Attorney, Agent, or Firm* — Drinker Biddle & Reath LLP

(57) ABSTRACT

There are provided steps of providing a dielectric layer and a wiring layer on a surface of a support to form an intermediate body, removing the support from the intermediate body to obtain a wiring board, and carrying out a roughening treatment over a surface of the support before the intermediate body forming step.

11 Claims, 15 Drawing Sheets $y = -0.0255x + 108.02$
$R^2 = 0.9491$ $y = -3.6218x + 113.29$
$R^2 = 0.9218$

WIRING BOARD, SEMICONDUCTOR APPARATUS AND METHOD OF MANUFACTURING THEM

TECHNICAL FIELD

The present disclosure relates to a wiring board to be used in a semiconductor apparatus or a semiconductor package and a method of manufacturing the wiring board. More particularly, the present disclosure relates to a wiring board formed by using a support for a reinforcement in a manufacturing process to provide an insulating layer and a wiring layer on the support through a build-up method and then removing the support and a method of manufacturing the wiring board. Furthermore, the present disclosure relates to a semiconductor apparatus formed by using a wiring board formed through the same method and a method of manufacturing the semiconductor apparatus.

RELATED ART

A support is used for a reinforcement in a manufacture of a wiring board. As the related art of the case in which the wiring board is thus manufactured by using the support, there has been known a method of manufacturing a wiring board in which a dielectric layer (an insulating layer or a solder resist layer) and a wiring layer are provided on a surface of the support to form an intermediate body and the support is removed from the intermediate body to obtain the wiring board.

FIGS. 1 and 2 show an example in which a semiconductor device is provided on the wiring board obtained by the manufacturing method and a semiconductor apparatus is thus obtained. In FIG. 1, a wiring board (a multilayer wiring board or a semiconductor package) 10 is formed by alternately providing a wiring layer 10b and an insulating layer 10c to be a dielectric layer through a build-up method and a solder resist layer 11 is formed on an uppermost layer and a lowermost layer, for example. An electrical connection of the wiring layers 10b between the respective layers is carried out through a via portion penetrating the insulating layer 10c.

FIG. 2 shows a semiconductor device mounting portion in the semiconductor apparatus of FIG. 1 in detail. The solder resist layer 11 is provided on the uppermost layer of the wiring board 10 and an opening portion is formed in a predetermined position of the solder resist layer 11, and a connecting pad 17 to be electrically connected to the wiring layer 10b of the wiring board 10 through a via is formed on the opening portion.

A semiconductor device 13 is provided on the wiring board 10 through a flip-chip bonding. In this case, a solder is provided on the connecting pad 17 of the wiring board through an application of a solder paste, for example. Subsequently, a semiconductor device 13 having a bump 14 formed on a terminal is positioned on the connecting pad 17, and the solder 16 and the bump 14 are molten to electrically connect the semiconductor device 13 to the connecting pad 17. Then, a liquid underfill resin 12 is filled and cured between the semiconductor device 13 and the solder resist layer 11 of the wiring board 10.

For the related art related to the invention, the following documents have been known. The wiring board (the semiconductor apparatus) shown as the related-art examples in FIGS. 1 and 2 has been described in the following Patent Document 1 and Patent Document 2, and particularly, corresponds to a multilayer wiring board according to embodiments in FIG. 1 (a first embodiment) and FIG. 9 (a ninth embodiment) in the Patent Document 2.

According to the Patent Document 1 (Japanese Patent Unexamined Application Publication No. 2000-323613), it has been disclosed that a via for electrically connecting a conductor wiring and/or a pad which is formed on both sides of an insulating layer is formed to penetrate an insulator and is formed as a recess portion taking a shape of a truncated cone and having an opening area opened on an external connecting terminal side which is larger than a bottom area on a semiconductor device mounting surface side in order to form a mounting surface on which the semiconductor device is to be mounted as flatly as possible and to reduce a thickness as greatly as possible in a multilayer board for a semiconductor apparatus. Moreover, it has been disclosed that a seed layer is formed between a metal plate and a pad for a semiconductor device in order to enhance an adhesion between the pad for the semiconductor device and a metal plate.

In the Patent Document 2 (Japanese Patent Unexamined Application Publication No. 2007-13092), moreover, it has been disclosed that a first solder resist layer is formed on a support substrate, a first opening portion is formed on the first solder resist layer, a semiconductor device mounting electrode is formed on the first opening portion, an insulating layer is formed on the electrode, and a wiring portion to be connected to the electrode is formed on the insulating layer, and subsequently, a second solder resist layer is formed in a wiring portion and a second opening portion is formed on the second solder resist layer in order to obtain a wiring board in which a thickness can be reduced and which can correspond to a high density wiring. It has been disclosed that a support is removed to obtain a wiring board.

[Patent Document 1] Japanese Patent Unexamined Application Publication No. 2000-323613

[Patent Document 2] Japanese Patent Unexamined Application Publication No. 2007-13092

As described above, for example, according to the semiconductor apparatus in accordance with the related art shown in FIGS. 1 and 2, in some cases in which a surface of the solder resist layer 11 on a surface of the wiring board 10 which is provided in contact with the support is set to be a mounting surface 27 of the semiconductor device 13, the surface of the solder resist layer 11 is excessively flattened and a wettability of the solder resist layer 11 is insufficient. In this case, there is a possibility that a void 15 might be generated in the underfill resin 12 as shown in FIG. 2 and peeling might be caused between the underfill resin 12 and the solder resist layer 11 to be a dielectric layer. To the contrary, in the case in which the wettability of the solder resist layer 11 is excessively sufficient, the underfill resin 12 excessively flows over the wiring board 10. Consequently, a defective appearance of a finished semiconductor package is generated.

As described above, in the wiring board (the semiconductor apparatus) shown in the related art of FIGS. 1 and 2, the dielectric layer (the insulating layer and the solder resist layer) and the wiring layer are simply provided on the support to form an intermediate body and the support is removed from the intermediate body to obtain the wiring board. In general, a surface of a metal plate or a metal foil which is not subjected to any processing is very flat. In some cases in which the metal plate or the metal foil is used as the support and a surface of the wiring board from which the support is removed is set to be the semiconductor device mounting surface, therefore, the surface of the solder resist layer is excessively flat. Accordingly, the wettability of the solder resist layer and the underfill resin is insufficient so that the void is generated in the underfill resin.

The related art described in the Patent Documents 1 and 2 is the same as the related-art examples shown in FIGS. 1 and 2 as described above. Also in the wiring board (the semiconductor apparatuses) described in the Patent Documents 1 and 2, accordingly, the same problem as that in the related-art examples shown in FIGS. 1 and 2 is caused.

SUMMARY

Exemplary embodiments of the present invention provide a method of manufacturing the wiring board and a semiconductor apparatus which can adjust a wettability between an underfill resin and an insulating layer or a solder resist layer which serves as a semiconductor device mounting surface by setting the semiconductor device mounting surface as a roughened surface, and particularly, can control a flowability of the underfill resin when filling the underfill resin, thereby forming the underfill resin well so as to prevent a void from being generated, and the wiring board and the semiconductor apparatus which are manufactured by the method.

Moreover, exemplary embodiments of the present invention a method of manufacturing a wiring board and a semiconductor apparatus which can enhance an adhesion between a support and an insulating layer or a solder resist layer in a manufacture and can prevent a generation of a defect such as sudden peeling of the support and the wiring board during the manufacture by setting, as a roughened surface, a surface of a support on which the wiring board (an intermediate body) is to be formed in the case in which the insulating layer and a wiring layer are provided on the support to form the wiring board, and the wiring board and the semiconductor apparatus which are manufactured by the method.

A method of manufacturing a wiring board according to the invention includes steps of carrying out a roughening treatment over a surface of a support; providing a dielectric layer and a wiring layer on the surface of the support subjected to the roughening treatment to form an intermediate body, and removing the support from the intermediate body to obtain the wiring board.

In the specification of the application, an insulating layer or a solder resist layer, or a layer obtained by adding the insulating layer and the solder resist layer will be referred to as a "dielectric layer". Moreover, the dielectric layer (the insulating layer and the solder resist layer) and the wiring layer which are provided on the support immediately before the removal of the support will be referred to as an "intermediate body".

Moreover, the method of manufacturing a semiconductor apparatus according to the invention includes steps of carrying out a roughening treatment over a surface of a support; providing a dielectric layer and a wiring layer on the surface of the support subjected to the roughening treatment to form an intermediate body, removing the support from the intermediate body to obtain the wiring board, and mounting a semiconductor device on a surface of the wiring board from which the support is removed.

Furthermore, the method of manufacturing a semiconductor apparatus according to the invention includes steps of carrying out a roughening treatment over a surface of a support; providing a dielectric layer and a wiring layer on the surface of the support subjected to the roughening treatment to form an intermediate body, removing the support from the intermediate body to obtain the wiring board, and mounting a semiconductor device on an opposed surface to a surface of the wiring board from which the support is removed.

Moreover, the method of manufacturing a semiconductor apparatus according to the invention includes steps of carrying out a roughening treatment over a surface of a support, providing a dielectric layer and a wiring layer on the surface of the support subjected to the roughening treatment to form an intermediate body, mounting a semiconductor device on a surface of the intermediate body which is opposed to a contact surface with the support, and removing the support from the intermediate body to obtain the semiconductor apparatus.

In the method of manufacturing a wiring board or a semiconductor apparatus according to the invention, furthermore, the support is formed of a metal and the roughening treatment is carried out over the surface of the support by etching, thereby forming a roughened surface. Alternatively, the support is formed of a metal and an oxide film is provided by an oxidizing treatment to carry out the roughening treatment over the surface of the support, thereby forming a roughened surface.

Further, in the method of manufacturing a wiring board or a semiconductor apparatus according to the invention, before or after carrying out the roughening treatment over the surface of the support, a connecting pad is formed on the surface of the support, and then the intermediate body is formed on the surface of the support provided with the connecting pad.

The invention provides a wiring board comprising a dielectric layer and a wiring layer, wherein one surface of the wiring board serves as a semiconductor device mounting surface and the other surface which is opposed to the surface of the wiring board serves as an external connecting terminal surface, and wherein a surface of the dielectric layer of the semiconductor device mounting surface or the external connecting terminal surface is formed as a roughened surface.

Moreover, the invention provides a semiconductor apparatus comprising:

a wiring board having a dielectric layer and a wiring layer, wherein one surface of the wiring board serves as a semiconductor device mounting surface and the other surface which is opposed to the surface of the wiring board serves as an external connecting terminal surface, and wherein a surface of the dielectric layer of the semiconductor device mounting surface is formed as a roughened surface;

a semiconductor device mounted on the semiconductor device mounting surface through a flip-chip bonding; and an underfill resin filled between the semiconductor device and the semiconductor device mounting surface.

Furthermore, the invention provides a semiconductor apparatus comprising:

a wiring board having a dielectric layer and a wiring layer, wherein one surface of the wiring board serves as a semiconductor device mounting surface and the other surface which is opposed to the surface of the wiring board serves as an external connecting terminal surface, and wherein a surface of the dielectric layer of the external connecting terminal surface is formed as a roughened surface; and a semiconductor device mounted on the semiconductor device mounting surface.

As described above, according to the invention, the roughening treatment is carried out before the dielectric layer or the wiring layer is formed on the surface of the support. Therefore, it is possible to adjust the wettability between the underfill resin and the insulating layer or the solder resist layer (that is, the dielectric layer). In particular, the flowability of the liquid underfill resin in filling of the underfill resin is controlled so that a void can be prevented from being generated in the underfill resin. Accordingly, it is possible to fill the underfill resin well between the semiconductor device and the wiring board.

By setting the surface of the support to be the roughened surface, moreover, it is possible to enhance an adhesion of the support and the insulating layer or the solder resist layer (the dielectric layer) during the manufacture. Consequently, it is possible to prevent the support and the wiring board from being suddenly peeled in the manufacture. Accordingly, it is possible to prevent a manufacturing defect of the wiring board or the semiconductor apparatus from being generated.

According to the related art shown in FIG. 2, particularly, prior to the mounting of the semiconductor device, it is necessary to roughen the surface of the solder resist layer 11 through etching such as a plasma processing or a desmear processing after removing the support in order to prevent the void 15 from being generated in the underfill resin 12. On the other hand, according to the invention, it is possible to transfer the surface shape of the roughened surface of the support onto the surface of the solder resist layer by roughening the surface of the support. Accordingly, it is not necessary to carry out a special roughening treatment for the solder resist layer in order to prevent the void from being generated in the underfill resin.

Other features and advantages may be apparent from the following detailed description, the accompanying drawings and the claims.

DETAILED DESCRIPTION

Embodiments according to the invention will be described below in detail with reference to the accompanying drawings.

Figure 3A:
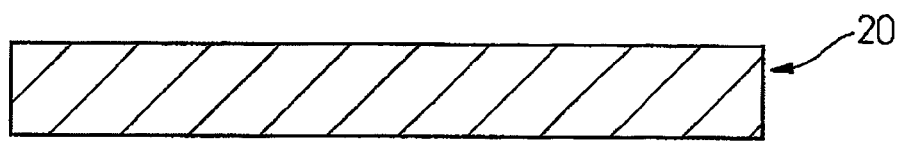

FIGS. 3A to 4D show a method of manufacturing a wiring board according to a first embodiment of the invention in order of steps. In FIG. 3A, a support 20 is prepared. For the support 20, a metal plate formed of Cu or a metal foil formed of Cu in the same manner is generally used, for example. In case of a copper foil formed of Cu, a rolled copper foil or an electrolytic copper foil is suitably used.

Figure 3B:
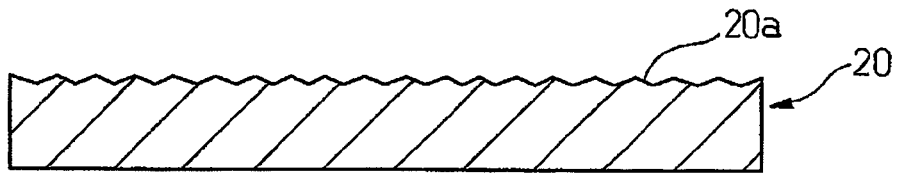
Figure 3C:
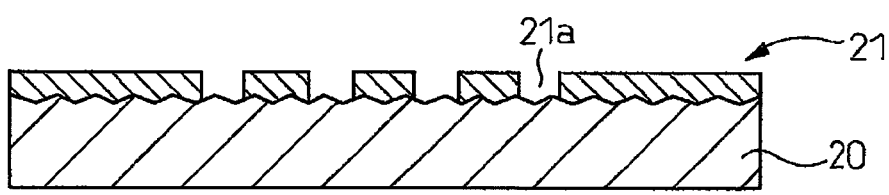

A surface treatment for roughening a surface of the support 20 forming an insulating layer 23 is carried out at a subsequent step. Examples of a surface treatment include etching, oxidation, plating and blasting. As will be described below, in the examples according to the invention, there is carried out a so-called roughening treatment for carrying out soft etching (wet etching) by spraying an ammonium persulfate solution onto the surface of the support 20. FIG. 3B shows a surface 20a of the support 20 which is changed into a very small concavo-convex surface through the execution of the roughening treatment.

Next, electrolytic plating is carried out. More specifically, in FIG. 3C, a plated resist layer 21 is formed on a surface of a support 20 and is subjected to patterning by an ordinary method. Examples of a patterning method include a pattern forming method using screen printing and a pattern forming method using a photolithographic process. In case of the photolithographic process, a mask (not shown) having a plurality of openings in a predetermined position is utilized to carry out exposure and development, thereby removing the plated resist layer 21 in the exposed portion to form a large number of opening portions 21a.

Figure 3D:
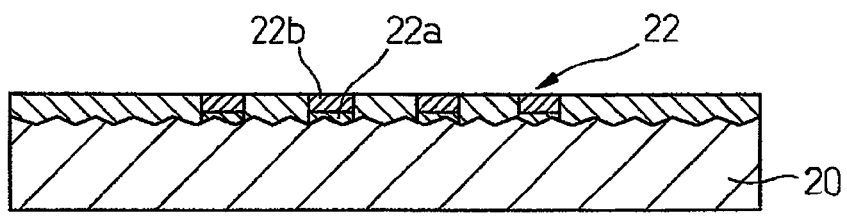
Figure 3E:
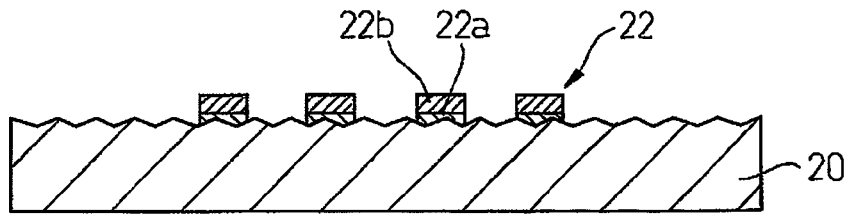

As shown in FIG. 3D, next, electrolytic plating is carried out by setting the support 20 itself as one of electrodes. For the electrolytic plating in this case, an Au plated layer 22a and an Ni plated layer 22b are formed on the opening portion 21a of the plated resist 21 to obtain a plated layer 22. In the case in which a semiconductor device is provided by a flip-chip method at a subsequent step, the plated layer 22 is used as a connecting pad to be connected to an electrode terminal of the semiconductor device or is used as a connecting pad of an external connecting terminal. For the plated layer, however, it is possible to provide layers in a combination of /Ni/Cu, Au/Pd/Ni/Cu, and Ni/Cu in order from the support 20 side. In FIG. 3E, next, the plated resist layer 21 is removed.

Figure 3F:
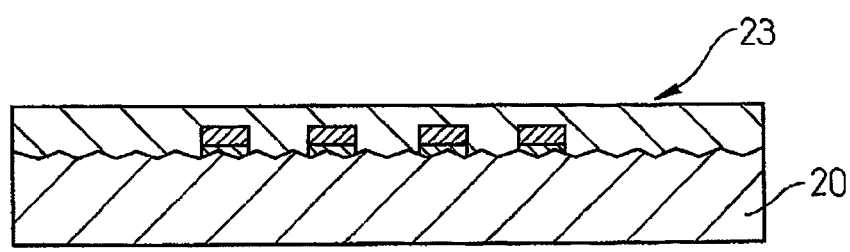

As shown in FIG. 3F, then, a resin film constituted by an epoxy resin or a polyimide resin is provided on a whole surface of the support 20 on which the plated layer 22 constituted by the Au plated layer 22a and the Ni plated layer 22b is formed. Thus, an insulating layer 23 is formed as a dielectric layer. In this case, the roughening treatment is previously carried out over the surface 20a of the support 20. Therefore, an adhesion between the support 20 and the insulating layer 23 is maintained to be high and a reinforcing function in a process for manufacturing the wiring board is sufficiently fulfilled, and furthermore, troubles are not made in the case in which the support 20 is removed at a subsequent step.

Figure 4A:
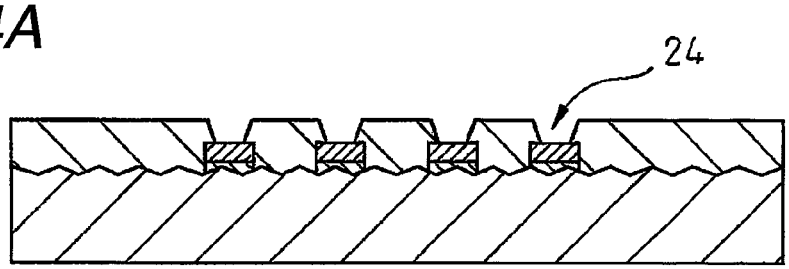
FIGS. 4A to 4D are views showing the method of manufacturing a wiring board according to the first embodiment of the invention (a second half part)
Figure 4B:
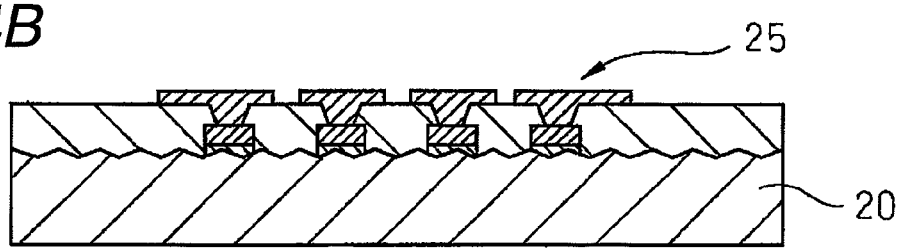

In FIG. 4A, thereafter, a via hole 24 to be an opening portion is formed to penetrate the insulating layer 23 through a laser processing to aim at the plated layer 22 provided on the support 20. The via hole 24 takes a shape of an inverted truncated cone having a larger area on the opening portion side than an area on a bottom side. Consequently, the plated layer 22 is exposed to a bottom surface of the via hole 24. In FIG. 4B, next, a wiring layer 25 constituted by a via and a pattern is formed as a metal layer covering a region including the bottom surface and wall surface of the via hole 24 through a semiadditive method. Consequently, the wiring layer 25 is electrically connected to the plated layer 22 provided in contact with the support 20 through the via portion.

Figure 4C:
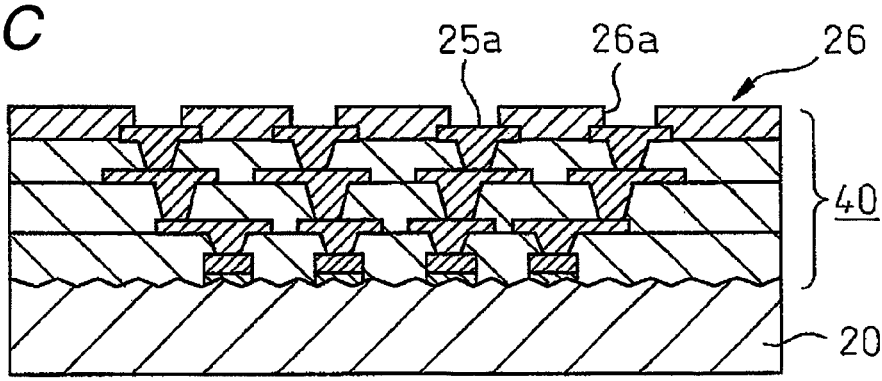

As shown in FIG. 4C, similarly, the respective steps of forming the insulating layer 23 (FIG. 3E), forming the via hole 24 (FIG. 4A) and forming the wiring layer 25 (FIG. 4B) are repeated at a necessary number of times for forming a predetermined multilayer wiring board. Then, the insulating layer 23 and the wiring layer 25 which are uppermost layers are covered to form a solder resist 26 serving as a dielectric layer and patterning is thus carried out. As a patterning method, in the same manner as described above, a mask (not shown) having an opening in a corresponding position to a conductor pad 25a for an external connecting terminal is utilized to carry out exposure and development, thereby removing the solder resist 26 in the exposed portion and forming an opening portion 26a to expose the conductor pad 25a for an external connecting terminal of the wiring layer 25 to be the uppermost layer. Thus, a wiring board (a multilayer wiring board or a semiconductor package) is formed on the support 20 and the wiring board set into a state in which the support 20 is not removed is referred to as an "intermediate body" 40 in this specification.

Figure 4D:
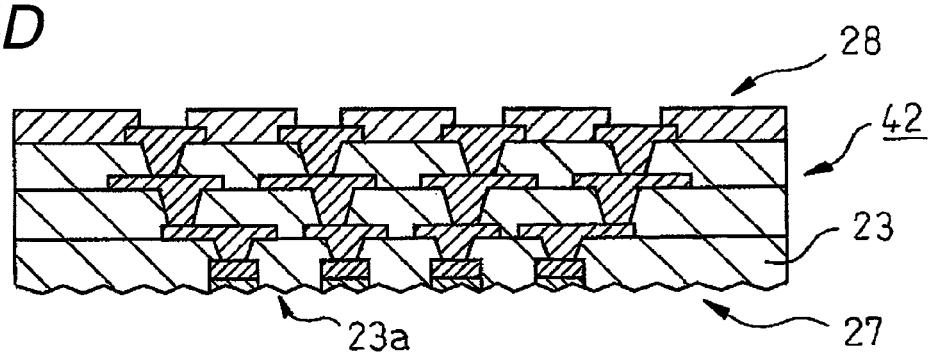

As shown in FIG. 4D, next, the support 20 is removed by etching. Consequently, a surface of the multilayer wiring board from which the support 20 is removed serves as a semiconductor device mounting surface 27 for mounting a semiconductor device. On the other hand, as described above, a surface of the multilayer wiring board from which the conductor pad 25a for an external connecting terminal of the wiring layer 25 to be the uppermost layer serves as an external connecting terminal surface 28. Thus, there is finished a wiring board (a multilayer wiring board or a semiconductor package) 42 having the semiconductor device mounting surface on one surface and the external connecting terminal surface on the other surface.

In this case, a surface shape of a roughened surface 20a of the support 20 is transferred onto the insulating layer 23 of the semiconductor device mounting surface 27 so that the semiconductor device mounting surface 27 serves as a roughened surface 23a.

Figure 5:
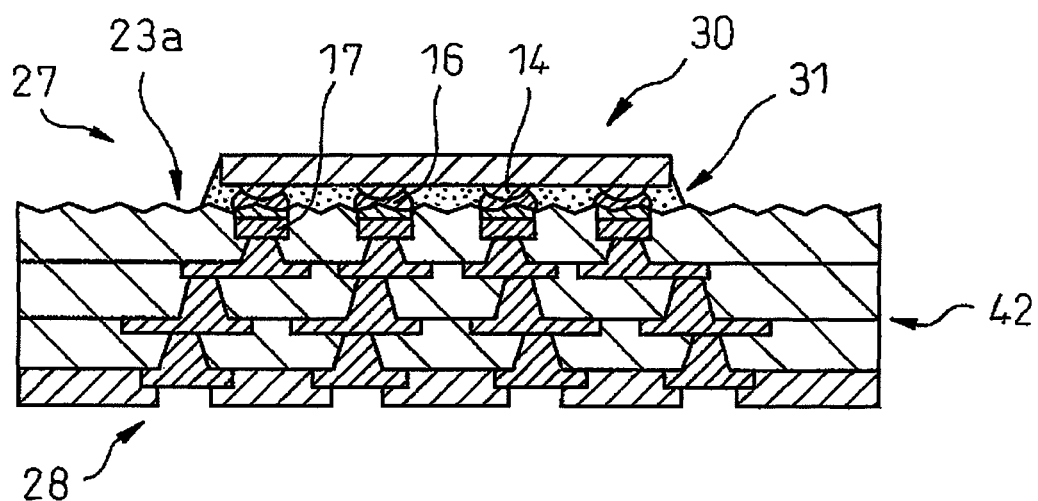
FIG. 5 is a sectional view showing a semiconductor apparatus using the wiring board manufactured according to the first embodiment.

FIG. 5 shows a state in which a semiconductor device 30 is mounted on the semiconductor device mounting surface 27 of the wiring board 42 which is finished through the steps shown in FIGS. 3A to 4D. In FIG. 5, the finished wiring board 42 shown in FIG. 4D is vertically inverted and the semiconductor device mounting surface 27 is set to be an upper side. In order to mount the semiconductor device 30 on the wiring board 42, an electrode of the semiconductor device 30 and the connecting pad 17 on the wiring board side are electrically connected to each other through a flip-chip method and an underfill resin 31 is filled between the semiconductor device 30 and the wiring board. In the case in which the semiconductor device 30 is mounted on the wiring board (semiconductor package) 42 through a flip-chip bonding, for example, a solder is provided on the connecting pad 17 of the wiring board 42 through an application of the solder paste 16, and subsequently, the semiconductor device 30 having the bump 14 formed on a terminal is positioned on the connecting pad 17, and the solder 16 and the bump 14 are molten to electrically connect the semiconductor device 30 to the connecting pad 17. Then, an underfill resin 31 is filled and cured between the semiconductor device 30 and the wiring board (the insulating layer or the solder resist layer) 42.

In this case, a flow of the underfill resin 31 can be controlled by the roughened surface 23a. Accordingly, the underfill resin 31 can be filled well so as not to generate a void.

Next, a method of manufacturing a wiring board according to a second embodiment of the invention will be described in order of steps with reference to FIGS. 6 to 7B. In the second embodiment, the steps described with reference to FIGS. 3A to 3F in the first embodiment are exactly executed and the steps shown in FIGS. 4A and 4B are executed. More specifically, in FIG. 6, a via hole 24 is formed on an insulating layer 23 through a laser processing to aim at a plated layer 22 provided on a support 20, the plated layer 22 is exposed to a bottom surface of the via hole 24, and furthermore, a wiring layer 25 constituted by a via and a pattern is formed by a semiadditive method, for example, in the same manner as in the step of FIG. 4A. Consequently, the wiring layer 25 is electrically connected to the plated layer 22 provided in contact with the support 20 through the via portion.

Subsequently, a solder resist 26 is formed on the insulating layer 23 and the wiring layer 25 and is subjected to patterning. As a patterning method, for example, a mask (not shown) having an opening in a corresponding position to a conductor pad 25a of the wiring layer 25 is utilized to carry out exposure and development, thereby removing the solder resist 26 in the exposed portion and forming an opening portion 26a to expose the conductor pad 25a of the wiring layer 25. A plated layer 33 constituted by Au plating and Ni plating is formed on the conductor pad 25a through nonelectrolytic plating. A composition of the plated layer 22 in this case can also be obtained in another combination in the same manner as in the case shown in FIG. 3C.

Figure 7A:
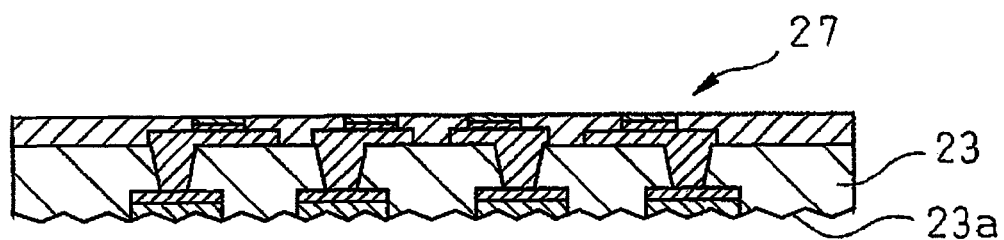
FIGS. 7A and 7B are views showing a process for manufacturing a wiring board which succeeds to the step of FIG. 6, FIGS. 8A and 8B are views showing a variant of a process for manufacturing a wiring board according to the second embodiment of the invention.

As shown in FIG. 7A, next, the support 20 is removed by etching. Consequently, a surface of the wiring board from which the support 20 is removed serves as an external connecting terminal surface 28, for example. In this case, a surface 23a of an insulating layer forming the external connecting terminal surface 28 is a roughened surface. On the other hand, as described above, a side on which the connecting pad 33 formed by the plated layer is provided on the conductor pad 25a of the wiring layer 25 serves as a semiconductor device mounting surface 27. Thus, there is finished a wiring board having the semiconductor device mounting surface 27 on one surface and the external connecting terminal surface 28 on the other surface. As a typical example of the case in which a surface of the wiring board from which the support 20 is removed is set to be the external connecting terminal surface 28, for instance, it is possible to propose the case in which the wiring board is used as an interposer. In this case, an underfill resin (not shown) is filled between the external connecting terminal surface 28 of the wiring board serving as the interposer and a mounting substrate (not shown).

Figure 7B:
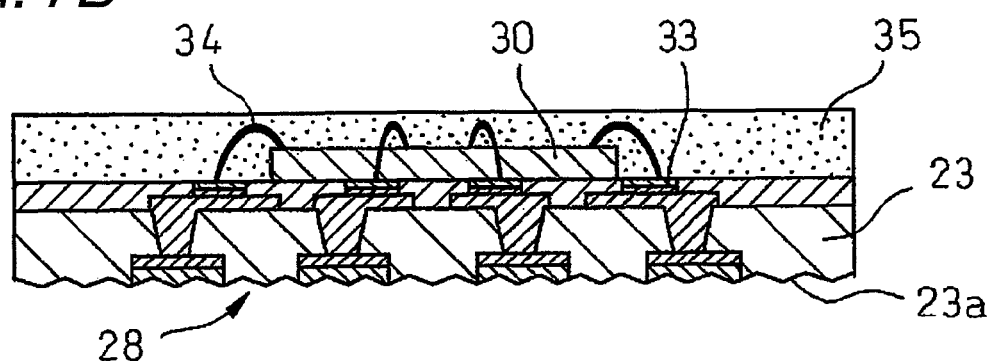

In FIG. 7B, a semiconductor device 30 is mounted on the semiconductor device mounting surface 27 of the wiring board and an electrode terminal of an upper surface of the semiconductor device 30 and the connecting pad 33 of the wiring board are connected to each other through a bonding wire 34, and a region including the semiconductor device 30 and the bonding wire 34 is sealed with a resin 35.

Figure 6:
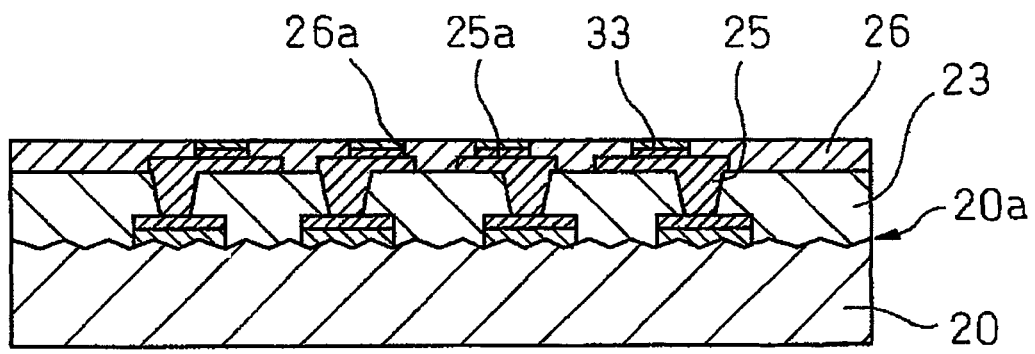
FIG. 6 is a view showing a process for manufacturing a wiring board according to a second embodiment of the invention.
Figure 8A:
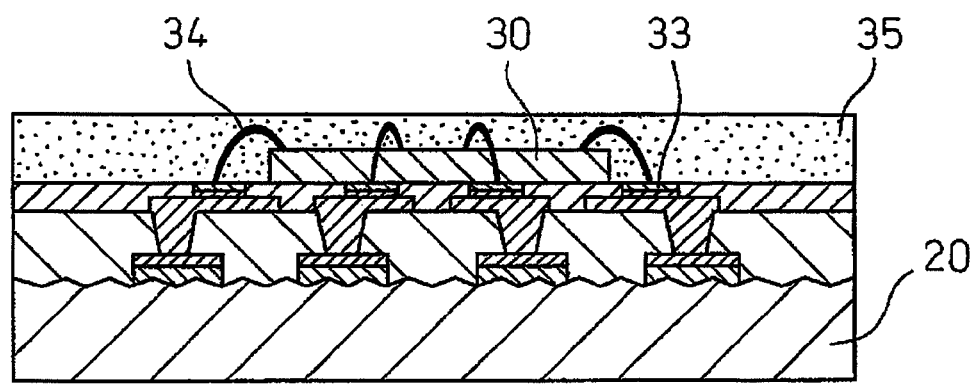
Figure 8B:
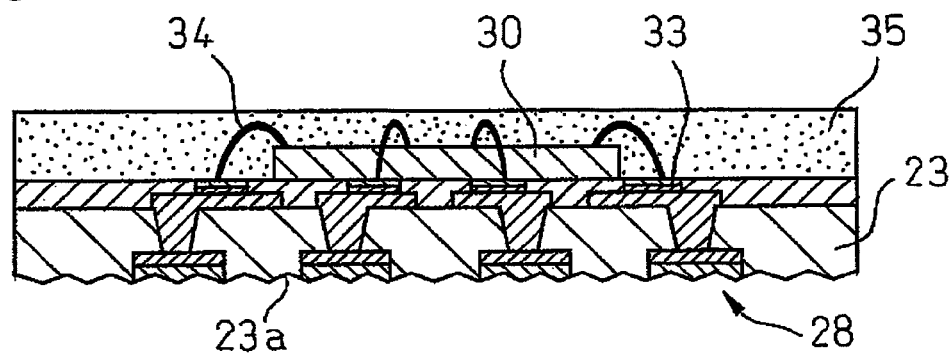

As shown in FIGS. 8A and 8B, alternatively, the semiconductor device 30 is mounted on the semiconductor device mounting surface 27 of the wiring board to which the support 20 is attached and the electrode terminal of the upper surface of the semiconductor device 30 and the connecting pad 33 of the wiring board are connected to each other through the bonding wire 34, and the region including the semiconductor device 30 and the bonding wire 34 is sealed with the resin 35 in a state in which the support 20 has not been removed, that is, as shown in FIG. 6. After the resin sealing is carried out, the support 20 is removed by etching so that a semiconductor apparatus provided with the semiconductor device 30 is finished. In this case, in the same manner as in FIG. 7A, the surface 23a of the insulating layer forming the external connecting terminal surface 28 is roughened.

Figure 9A:
FIGS. 9A to 9E are views showing a method of manufacturing a wiring board according to a third embodiment of the invention (a first half part)
Figure 9B:
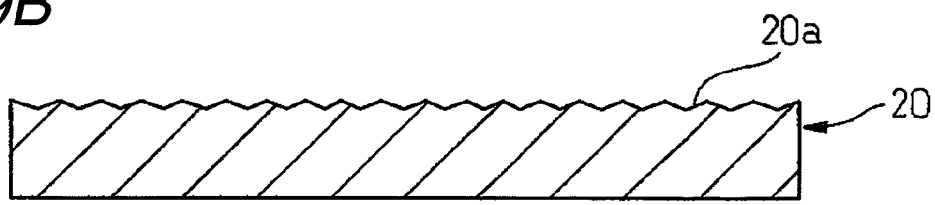
Figure 9C:
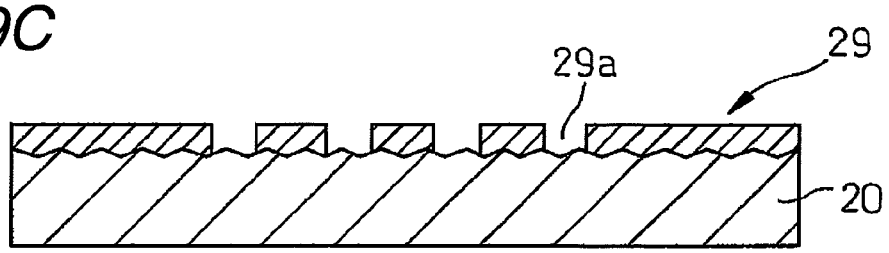

FIGS. 9A to 10D show a method of manufacturing a wiring board according to a third embodiment of the invention in order of steps. Description will be given to only different portions from the first embodiment shown in FIGS. 3A to 4D. Steps shown in FIGS. 9A to 9C are the same as the steps shown in FIGS. 3A to 3C.

The third embodiment (FIGS. 9A to 11) is characterized in that a solder resist is first formed on a support 20. Accordingly, a manufacturing process according to the third embodiment is different from that in the first embodiment. More specifically, a support 20 is prepared in FIG. 9A, a roughened surface 20a is formed in FIG. 9B and a solder resist layer 29 is formed in FIG. 9C.

Figure 9D:
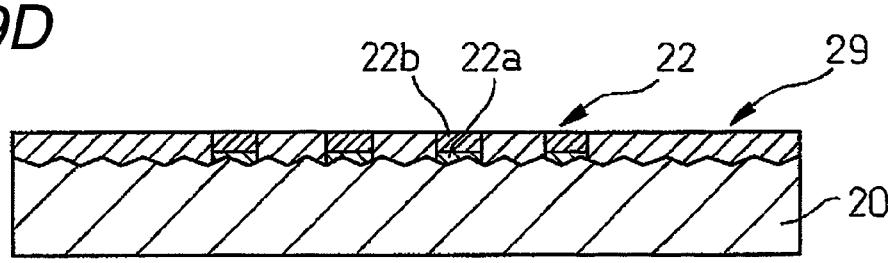
Figure 9E:
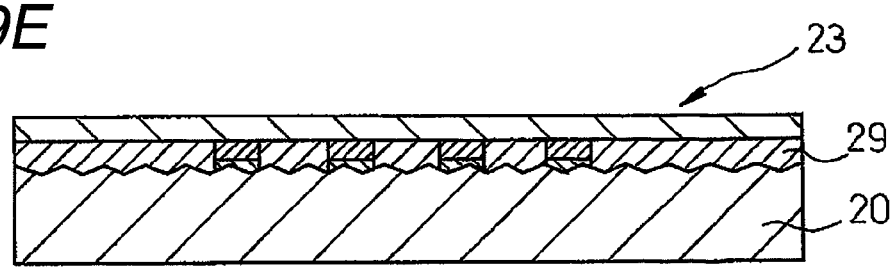

Subsequently, a plated layer 22 constituted by an Au plated layer 22a and an Ni plated layer 22b is formed on an opening portion 29a of the solder resist layer 29 as shown in FIG. 9D, and an insulating layer 23 is formed on the solder resist layer 29 and the plated layer 22 as shown in FIG. 9E.

Figure 10A:
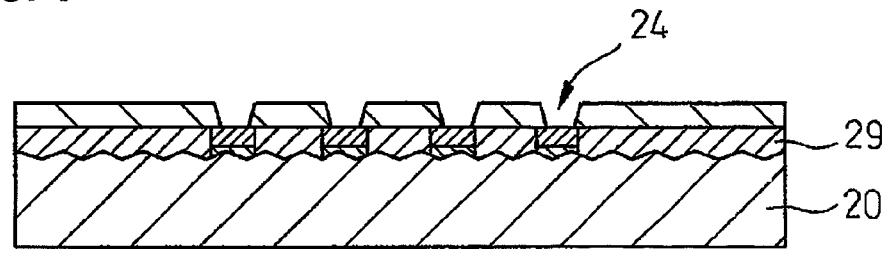
FIGS. 10A to 10D are views showing the method of manufacturing a wiring board according to the third embodiment of the invention (a second half part)
Figure 10B:
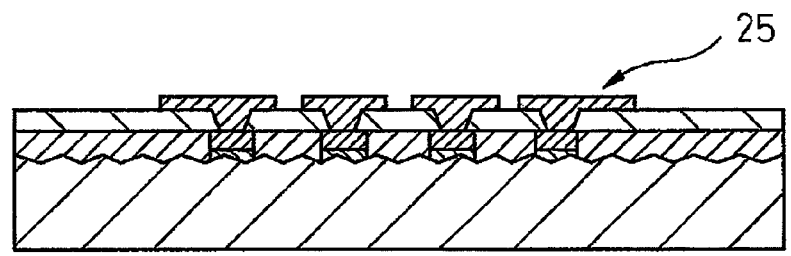

In FIG. 10A, thereafter, a via hole 24 to be an opening portion is formed to penetrate the insulating layer 23 through a laser processing to aim at the plated layer 22 provided on the support 20. The via hole 24 takes a shape of an inverted truncated cone having a larger area on the opening portion side than an area on a bottom side. Consequently, the plated layer 22 is exposed to a bottom surface of the via hole 24. In FIG. 10B, next, a wiring layer 25 constituted by a via and a pattern is formed as a metal layer covering a region including the bottom surface and wall surface of the via hole 24 by a semiadditive method, for example. Consequently, the wiring layer 25 is electrically connected to the plated layer 22 provided in contact with the support 20 through the via portion.

Figure 10C:
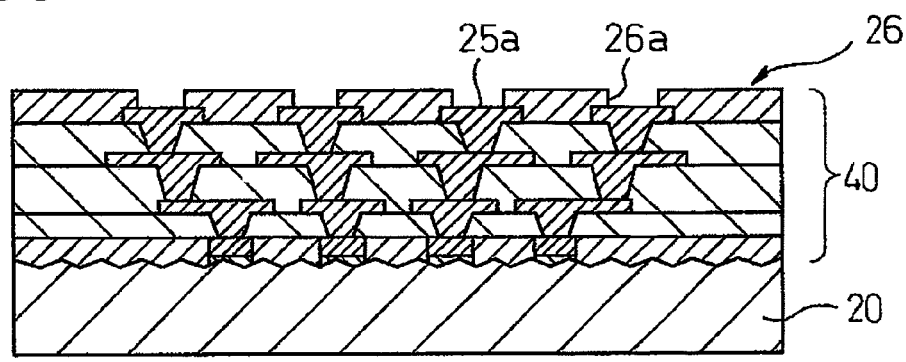

As shown in FIG. 10C, similarly, the respective steps of forming the insulating layer 23, forming the via hole 24 and forming the wiring layer 25 are repeated at a necessary number of times for forming a predetermined multilayer wiring board. Then, the insulating layer 23 and the wiring layer 25 which are uppermost layers are covered to form a solder resist 26 serving as a dielectric layer and patterning is carried out. Thus, there is formed an "intermediate body" 40 in which a wiring board (a multilayer wiring board or a semiconductor package) is provided on the support 20.

Figure 10D:
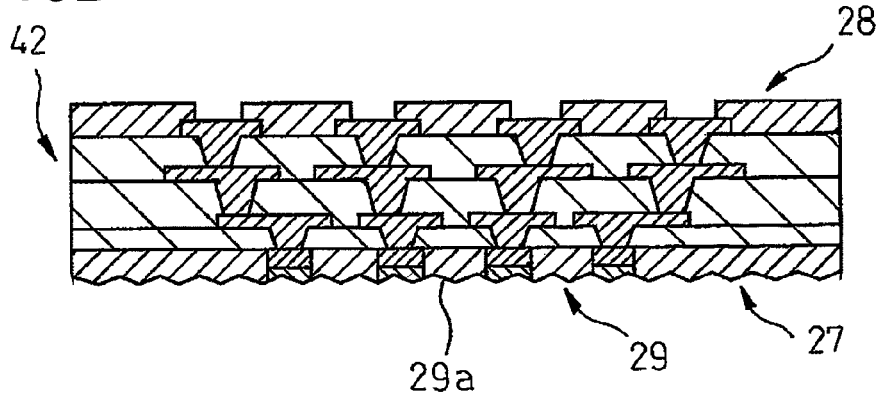

As shown in FIG. 10D, next, the support 20 is removed by etching. Consequently, a surface of the multilayer wiring board from which the support 20 is removed serves as a semiconductor device mounting surface 27 for mounting a semiconductor device. On the other hand, as described above, a surface of the multilayer wiring board from which the conductor pad 25a for an external connecting terminal of the wiring layer 25 to be the uppermost layer serves as an external connecting terminal surface 28. Thus, there is finished a wiring board (a multilayer wiring board or a semiconductor package) 42 having the semiconductor device mounting surface 27 on one surface and the external connecting terminal surface 28 on the other surface.

In this case, a surface shape of a roughened surface 20a of the support 20 is transferred onto the solder resist layer 29 of the semiconductor device mounting surface 27 so that the semiconductor device mounting surface 27 serves as a roughened surface 29a.

Figure 11:
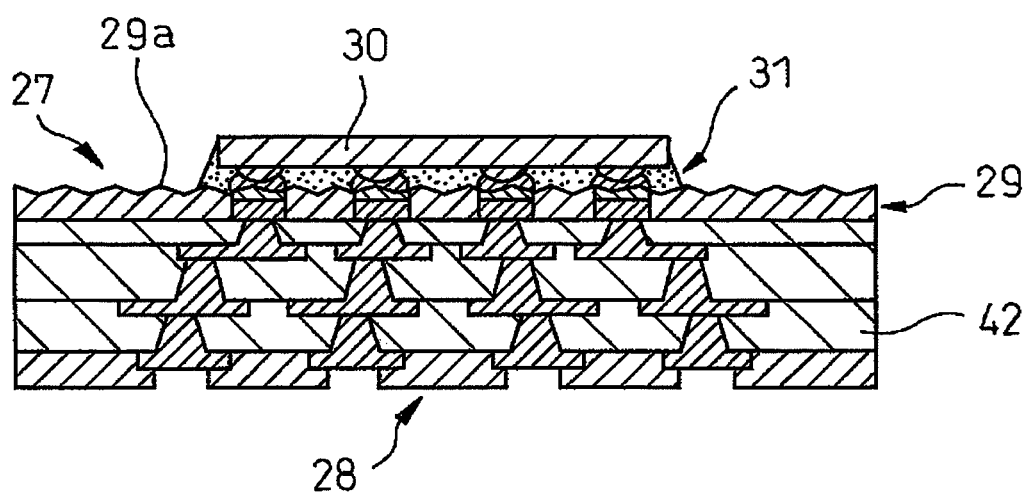
FIG. 11 is a sectional view showing a semiconductor apparatus using the wiring board manufactured according to the third embodiment.

FIG. 11 shows a state in which a semiconductor device 30 is mounted on the semiconductor device mounting surface 27 of the wiring board 42 which is finished at the steps shown in FIGS. 9A to 10D. In FIG. 11, the wiring board 42 finished in FIG. 10D is vertically inverted and the semiconductor device mounting surface 27 is shown as an upper side. A method of mounting the semiconductor device 30 on the wiring board 42 through a flip-chip bonding is the same as that in the first embodiment.

In the first and second embodiments, after the support 20 is subjected to the roughening treatment, the plated layer 22 (connecting pad) is formed. Therefore, the plated resist layer 21 is buried in the roughened surface of the support 20, so that an adhesion between the plated resist layer 21 and the support 20 is improved. Further, the plating solution for the plated layer 22 does not flow into portions placed below the plated resist layer 21, and thus, the plated layer 22 with a stable shape can be formed.

In the third embodiment, after the support 20 is subjected to the roughening treatment, the solder resist layer 29 is formed. Therefore, the solder resist layer 29 is buried in the roughened surface of the support 20, so that an adhesion between the solder resist layer 29 and the support 20 is improved. Further, the plating solution for the plated layer 22 does not flow into portions placed below the solder resist layer 29, and thus, the plated layer 22 with a stable shape can be formed. Further, since the adhesion between the solder resist layer 29 and the support 20 is improved, it is possible to prevent the intermediate body 40 and the support 20 from being peeled in the manufacturing process.

Further, in the first to third embodiments, after the roughened surface is formed on the support 20, the plated layer 22 (connecting pad) is formed. Therefore, it is possible to prevent the plated layer 22 from being damaged by etching, etc, due to the roughening treatment of the support 20. Therefore, the roughness degree of the support 20 can be adjusted while only considering the filling property of the underfill resin.

In order to perform the roughening treatment or removing treatment easily, the copper foil or copper plate is preferably used as the support 20. The plated layer 22 (connecting pad) may be constituted by layers including a layer made of the same material as the support 20, for example, by the combination of Au/Ni/Cu, Au/Pd/Ni/Cu, or Ni/Cu. In this case, it is preferable that the plated layer 22 is formed after the support 20 is subjected to the roughening treatment because the plated layer is not damaged by etching, etc. duce to the roughening treatment.

In a case where the surface of the plated layer 22 (connecting pad) is formed to be roughened surface, when the semiconductor chip is connected to the connecting pad by flip-chip bonding, the solder ball is mounted on the connecting pad, or the lead pin is soldered to the connecting pad, the gas vaporized from solder flux is discharged via a concave-convex portion of the roughened surface as a gas discharging path. Therefore, it is possible to prevent void by the gas from being generated within the solder. Thus, the solder bonding property is improved.

Figure 17A:
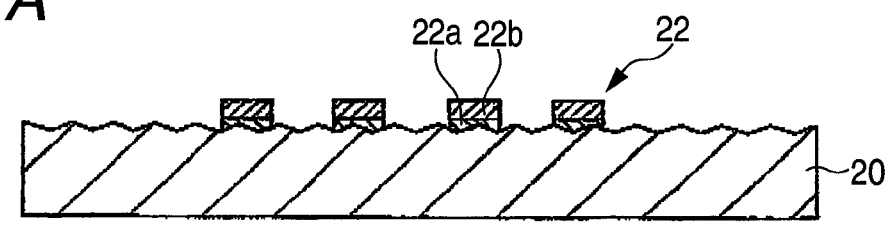
FIGS. 17A to 17C are views showing a method of manufacturing a wiring board according to a modified example of the first embodiment of the invention.
Figure 17B:
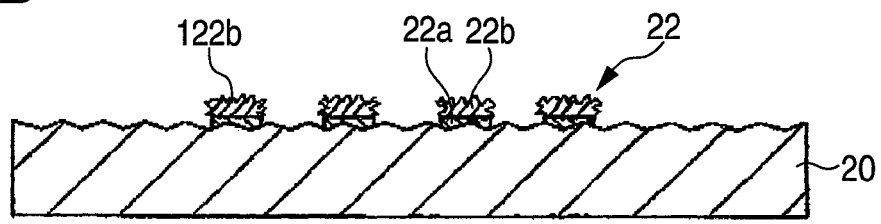
Figure 17C:
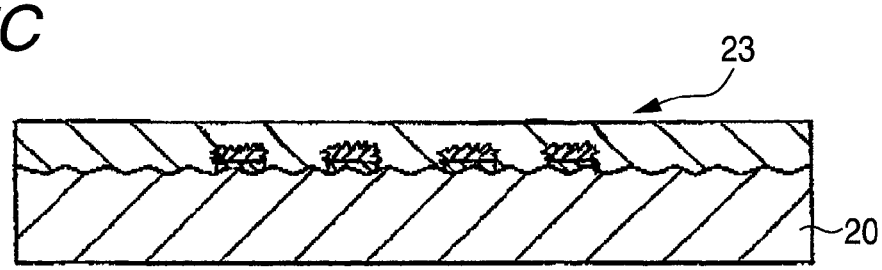

In the first to third embodiments, in order to improve an adhesion between the plated layer 22 and the insulating layer 23, it is preferable that in the process between FIG. 3E and FIG. 3F or the process between FIG. 9D and FIG. 9E, the surface of the plated layer 22 is subjected to the roughening treatment. For example, in the first embodiment, after the plated layer 22 is formed on the roughened surface of the support 20 (FIG. 3E, FIG. 17A), a roughening treatment is carried out over the surface of the plated layer 22 (FIG. 17B) so that the surface of the Ni plated layer 22b becomes a roughened surface 122b. In FIG. 17B, an etching liquid which roughens only the Ni Plated layer 22b is used in the roughening treatment. Next, the insulating layer 23 is formed on the whole surface of the support 20 on which the plated layer 22 is formed (FIG. 17C). After the insulating layer 23 is formed, the steps shown in FIGS. 4A to 5 are executed. By this treatment, the insulating layer 23 is buried into the roughened surface of the plated layer 22 and thus, the adhesion between the plated layer 22 and the insulating layer 23 is improved. Herein, the same method as the roughening treatment of the support 20 is used for this roughening treatment of the plated layer 22. In the first and second embodiments, if the plated layer 22 is subjected to the roughening treatment, the surface of the support 20 may be further subjected to the roughening treatment. Particularly, this becomes notably when the plated layer 22 (connecting pad) preferably includes a uppermost layer made of the same material as the support 20, for example, the plated layer 22 is constituted by the combination of Au/Ni/Cu, Au/Pd/Ni/Cu, or Ni/Cu. In this case, by considering the increase of the roughness degrees by the roughening treatment of the plated layer 22, the roughening treatment is carried out over the surface of the support 20.

FIGS. 12A to 13B show a method of manufacturing a wiring board according to a fourth embodiment of the invention in order of steps. Description will be given to only different portions from the first embodiment shown in FIGS. 3A to 4D. In the fourth embodiment, before a roughening treatment is carried out over a surface of a support 20, a plated resist layer 21 is formed on a surface of the support 20 and is subjected to patterning by an ordinary method as shown in FIG. 12B. Examples of a patterning method include a pattern forming method using screen printing and a pattern forming method using a photolithographic process. In case of the photolithographic process, a mask (not shown) having a plurality of openings in a predetermined position is utilized to carry out exposure and development, thereby removing the plated resist layer 21 in the exposed portion to form a large number of opening portions 21a.

Figure 12A:
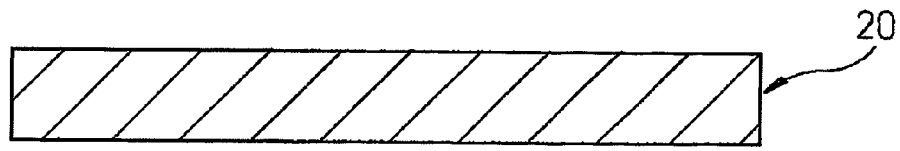
FIGS. 12A to 12E are views showing a method of manufacturing a wiring board according to a fourth embodiment of the invention (a first half part)
Figure 12B:
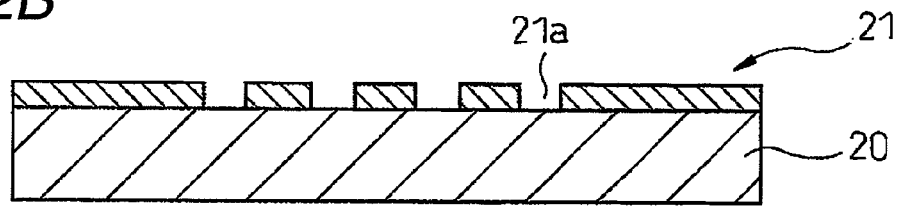
Figure 12C:
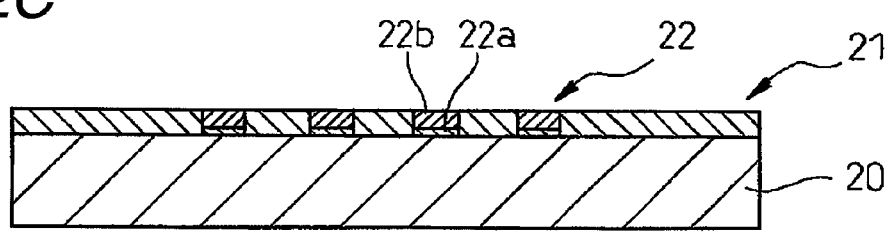
Figure 12D:
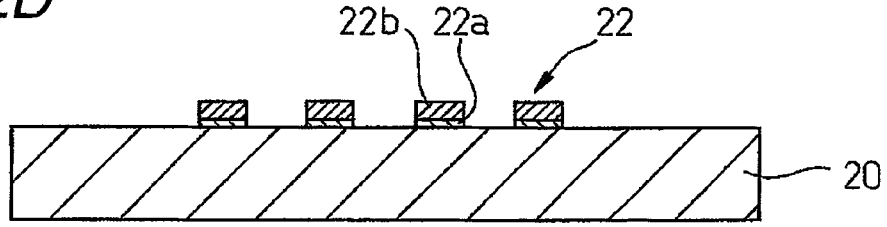

As shown in FIG. 12C, next, electrolytic plating is carried out by setting the support 20 itself as one of electrodes. For the electrolytic plating in this case, an Au plated layer 22a and an Ni plated layer 22b are formed on the opening portion 21a of the plated resist 21 to obtain a plated layer 22. Subsequently, the plated resist layer 21 is removed in FIG. 12D.

Figure 12E:
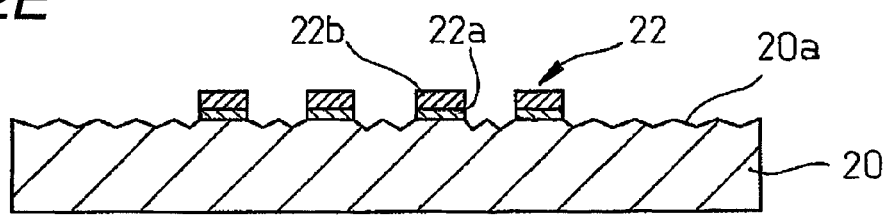

As shown in FIG. 12E, next, a surface treatment for roughening the surface of the support 20 is carried out. A surface treating method includes etching, oxidation, plating and blasting. As will be described below, in the example according to the invention, there is carried out a so-called roughening treatment for performing soft etching by spraying an ammonium persulfate solution onto the surface of the support 20. The plated layer 22 formed on the surface of the support 20 before the roughening is not influenced by the roughening treatment. Accordingly, the plated layer 22 is maintained to be formed on a flat surface at the surface of the support 20. More specifically, only the support 20 formed of copper is etched and a portion of the plated layer 22 formed of gold and nickel is not etched.

Figure 13A:
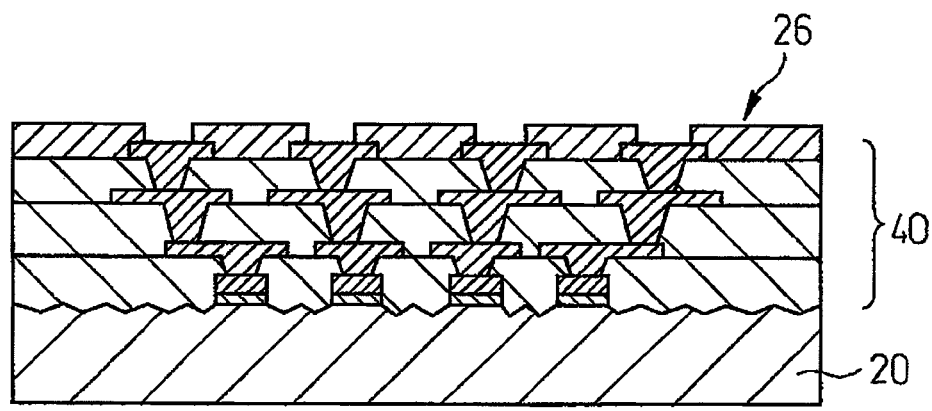
FIGS. 13A and 13B are views showing the method of manufacturing a wiring board according to the fourth embodiment of the invention (a second half part)

As shown in FIG. 13A, then, a resin film formed by an epoxy resin or a polyimide resin is provided over a whole surface of the support 20 having the plated layer 22 formed thereon. Consequently, an insulating layer 23 is formed. In this case, the roughening treatment is previously carried out over the surface 20a of the support 20. Therefore, an adhesion between the support 20 and the insulating layer 23 is maintained to be high and a reinforcing function in a process for manufacturing the wiring board is sufficiently fulfilled, and furthermore, troubles are not made in the case in which the support 20 is removed at a subsequent step. A via hole 24 to be an opening portion is formed to penetrate the insulating layer 23 through a laser processing to aim at the plated layer 22 provided on the support 20. The via hole 24 takes a shape of an inverted truncated cone having a larger area on the opening portion side than an area on a bottom side. Consequently, the plated layer 22 is exposed to a bottom surface of the via hole 24.

In the same manner as in the first embodiment, the respective steps of forming the insulating layer 23, forming the via hole 24 and forming the wiring layer 25 are repeated at a necessary number of times for forming a predetermined multilayer wiring board. Then, the insulating layer 23 and the wiring layer 25 which are uppermost layers are covered to form a solder resist 26 and patterning is carried out. Thus, there is formed an "intermediate body" 40 in which a wiring board (a multilayer wiring board or a semiconductor package) is provided on the support 20.

Figure 13B:
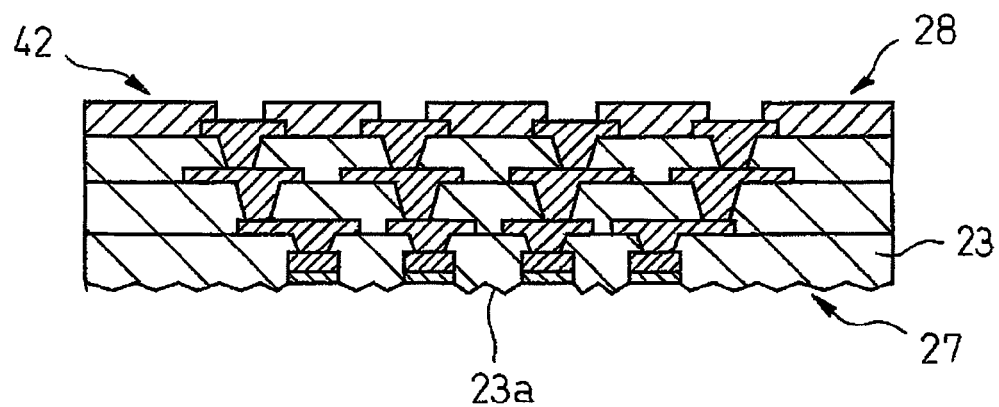

As shown in FIG. 13B, next, the support 20 is removed by etching. Consequently, a surface of the multilayer wiring board from which the support 20 is removed serves as a semiconductor device mounting surface 27 for mounting a semiconductor device. On the other hand, as described above, a surface of the multilayer wiring board from which the conductor pad 25a for an external connecting terminal of the wiring layer 25 to be the uppermost layer serves as an external connecting terminal surface 28. Thus, there is finished a wiring board (a multilayer wiring board or a semiconductor package) 42 having the semiconductor device mounting surface on one surface and the external connecting terminal surface on the other surface.

In this case, a surface shape of a roughened surface 20a of the support 20 is transferred onto the insulating layer 23 of the semiconductor device mounting surface 27 so that the semiconductor device mounting surface 27 serves as a roughened surface 23a.

Figure 14:
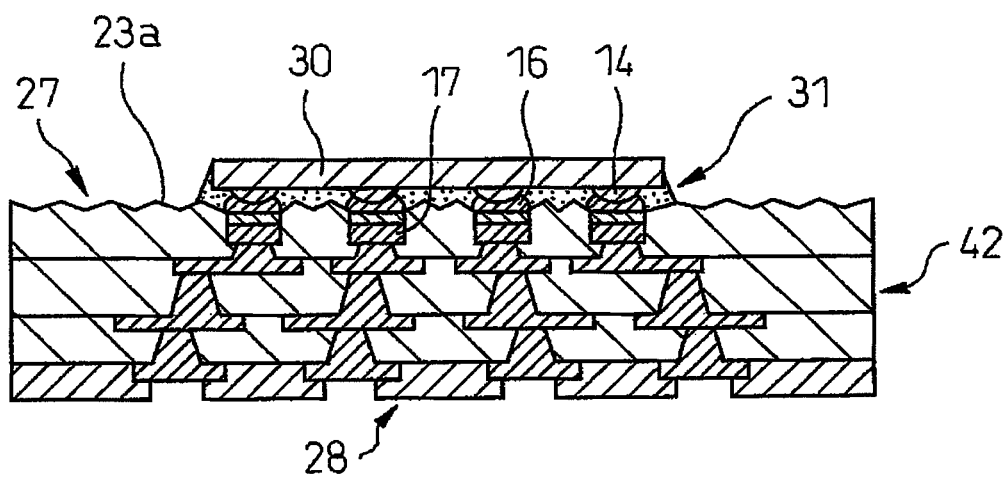
FIG. 14 is a sectional view showing a semiconductor apparatus using the wiring board manufactured according to the fourth embodiment.

FIG. 14 shows a state in which a semiconductor device 30 is mounted on the semiconductor device mounting surface 27 of the wiring board 42 which is finished at the steps shown in FIGS. 12A to 13B. In FIG. 14, the wiring board 42 finished in FIG. 13B is vertically inverted and the semiconductor device mounting surface 27 is shown as an upper side. The semiconductor device 30 is mounted on the wiring board 42 through a flip-chip bonding in the same manner as in the first embodiment.

As described above, in the fourth embodiment (FIGS. 12A to 14), the plated layer 22 serving as the connecting pad 17 is formed on the support 20 and the roughening treatment is then carried out over the support 20. More specifically, the plated layer 22 is formed on the flat support 20. For this reason, a back surface of the connecting pad 17 (an exposed surface from the insulating layer 23) is not influenced by the roughening treatment. Accordingly, a surface of the connecting pad 17 is formed as a flat surface. Therefore, the roughening treatment can solder bond the semiconductor device in the same manner as the related-art without influencing a solder bonding property of the connecting pad 17 when mounting the semiconductor device through the flip-chip bonding. More specifically, in the fourth embodiment, a degree of flatness of the surface of the connecting pad 17 mounting the semiconductor device is higher than that of the surface of the dielectric layer formed on the roughened surface as in the embodiment.

Figure 15:
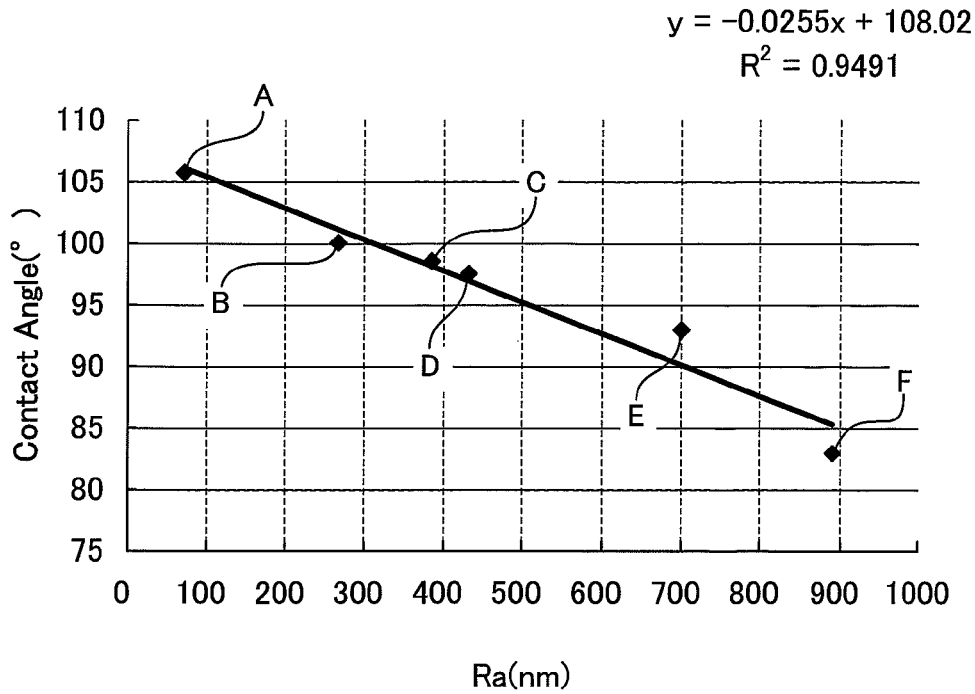
FIG. 15 is a chart showing a surface roughness of a support.
Figure 16:
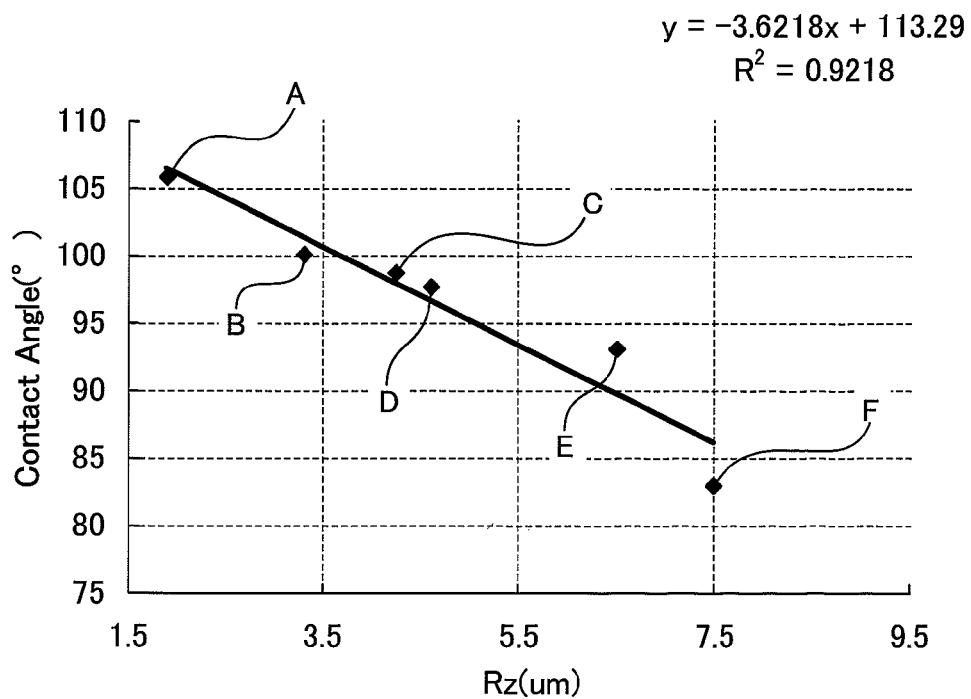
FIG. 16 is a chart showing the surface roughness of the support.

Table 1 shows a relationship between a wettability and a surface roughness over the surface of the wiring board according to the invention. Moreover, FIGS. 15 and 16 show the relationship between a wettability and a surface roughness in charts. In the process for manufacturing the wiring board according to the invention, a wettability to the insulating layer 23 is regulated due to a roughness caused by roughening the surface of the support 20. In FIGS. 15 and 16, "A" indicates the related-art example (1) "B" indicates the related-art example (2), "C" indicates the embodiment (1), "D" indicates the embodiment (2), "E" indicates the embodiment (3) and "F" indicates the embodiment (4). In the right upper corner of FIGS. 15 and 16, "y" indicates a formula of an approximate straight line in the graph and "$R^2$" indicates a matching degree between the appropriate straight line and measured values.

TABLE 1

| Structure | Detail | Before roughening treatment Ra (nm) | After roughening treatment Ra (nm) | After roughening treatment Rz (μm) | Contact angle |
|---|---|---|---|---|---|
| A: Related-art example (1) | — | — | 71.5 | 1.900 | 105.8 |
| B: Related-art example (2) | Roughening treatment after SR | — | 267.9 | 3.324 | 100.1 |
| C: Embodiment (1) | Rolled copper foil and blackening treatment | 30.0–40.0 | 385.3 | 4.250 | 98.6 |
| D: Embodiment (2) | Electrolytic copper foil and roughening treatment (1) | 200.0 | 432.1 | 4.596 | 97.6 |
| E: Embodiment (3) | Electrolytic copper foil and roughening treatment (2) | 200.0 | 700 | 6.5 | 93.0 |
| F: Comparative example | Electrolytic copper foil and roughening treatment (3) | 200.0 | 890 | 7.5 | 83.0 |

Figure 1:
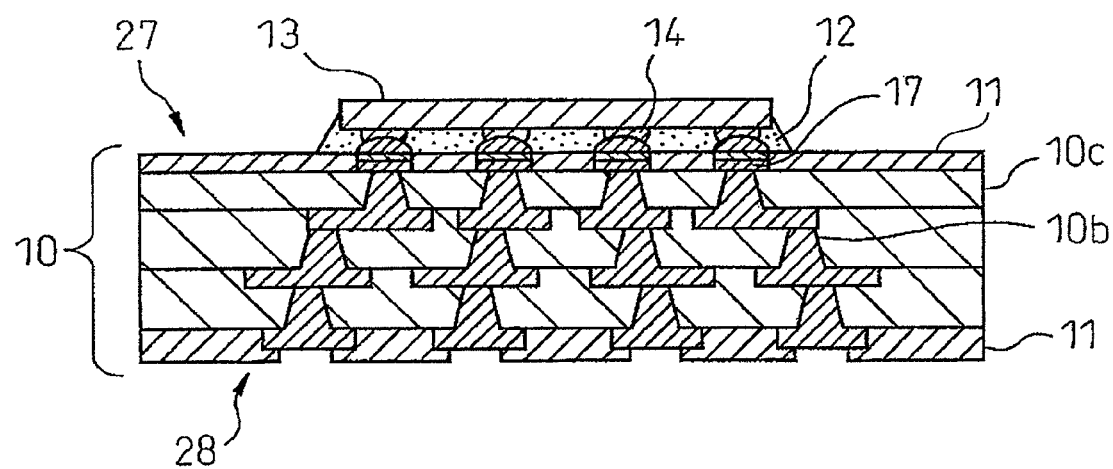
FIG. 1 is a sectional view showing a semiconductor package using a related-art multilayer wiring board.
Figure 2:
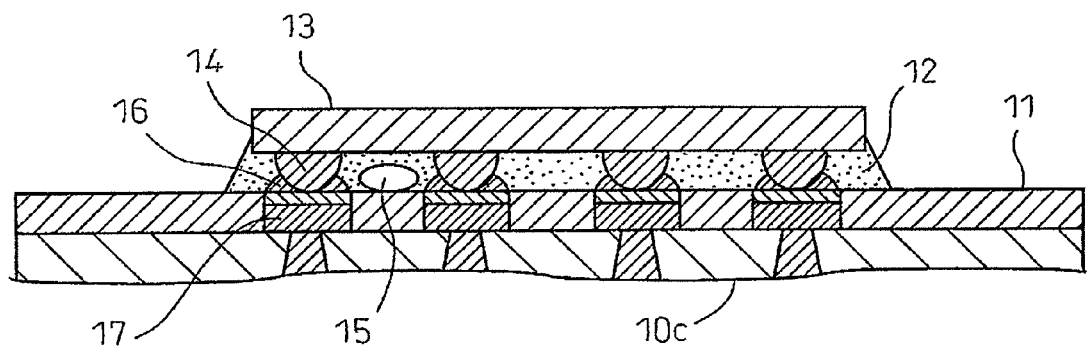
FIG. 2 is a detailed sectional view showing a semiconductor device mounting portion according to the related-art example of FIG. 1, FIGS. 3A to 3F are views showing a method of manufacturing a wiring board according to a first embodiment of the invention (a first half part)

The related-art example (1) indicates the case in which any roughening treatment is not carried out over the surface of the solder resist layer 11 in the related-art example shown in FIG. 2. The related-art example (2) indicates the case in which a so-called desmear treatment is carried out as the roughening treatment over the surface of the solder resist layer 11.

Moreover, the embodiment (1) indicates the case in which rolled copper foil is used as a material of the support 20 to obtain a wiring board by the support 20 subjected to the following blackening treatment (an oxidation treatment) for immersing a material into a blackening treatment solution (a mixed solution of sodium chlorite, sodium hydrate and sodium phosphate). Furthermore, the embodiments (2) and (3) and the comparative example indicate the cases in which electrolytic copper foil is used as the material of the support 20 to obtain the wiring board by the support 20 subjected to the following same roughening treatment.

Referring to the "roughening treatment", a surface of the electrolytic copper foil to be the support 20 was subjected to etching (in this case, so-called soft etching) by spraying an ammonium persulfate solution so that a surface roughness shown in the Table 1 was obtained.

In the case in which the "roughening treatment" is carried out by a chemical method, it is possible to propose etching (soft etching) with a sulfuric acid-hydrogen peroxide based etchant, etching to be carried out by spraying the formic roughening treatment solution, etc., in addition to the etching to be carried out by spraying the ammonium persulfate solution. Moreover, the roughening method includes a method which is referred to as a blackening treatment (an oxidation treatment) for immersing a material into a blackening treatment solution (for example, a mixed solution of sodium chlorite, sodium hydrate and sodium phosphate). By the method, an oxide film (an oxide film formed of a metal to be a support) is formed on the surface of the support and is thus changed into a roughened surface. Alternatively, examples of a physical roughening treatment method include a sand blasting method. In addition, it is also possible to propose a method of carrying out nickel plating for forming a plated surface like a needle or copper plating to form recesses and projections.

As described above, various roughening treatments could be carried out. Herein, in the embodiments (2) and (3) and the comparative example, there was carried out only the "roughening treatment" for etching (soft etching) the surface of the electrolytic copper by spraying the ammonium persulfate solution. The roughness degrees for the embodiments (2) and (3) and the comparative example were changed respectively by changing the time of splaying the ammonium persulfate solution.

As shown in the Table 1 or FIGS. 15 and 16, in the related-art example, Ra (nm) and Rz (μm) are greater, a contact angle of the surface of the solder resist layer is smaller, and a wettability is more enhanced in the case in which the roughening treatment is carried out over the surface of the solder resist layer, that is, the related-art example (2) than those in the case in which the roughening treatment is not carried out, that is, the related-art example (1). In the embodiments (1) to (3) according to the invention and the comparative example, it is apparent that Ra (nm) and Rz (μm) are greater, the contact angle of the semiconductor device mounting surface (the roughened surface) is considerably reduced, a surface roughness of the wiring board is brought into a "rough" state and the wettability is regulated as compared with the related-art examples (1) and (2).

Further, as a result of various examinations, the inventors found that the wettablity of the insulating layer is insufficient if the contact angle is more than 100° and the wettablity of the insulating layer is excessively sufficient if the contact angle is equal to or less than 87.5°. Therefore, as shown in the Table 1 or FIGS. 15 and 16, the roughness degree of the roughened surface is preferably in a range of 300 nm≦Ra≦800 nm and 3.5 μm≦Rz≦7 μm.

The wettability is obtained by dripping a waterdrop onto a surface of a sample and measuring a contact angle of water.

As in the related-art example (2), thus, the roughening treatment has been carried out by a desmear for the solder resist layer in the related art. In the treatment, however, it is found that only an insufficient roughened surface is obtained. In the case in which the insulating layer serves as the semiconductor device mounting surface as in the embodiments shown in FIGS. 3 to 5, the roughening treatment using the desmear is harder than the treatment for the solder resist. In addition, in the case in which the desmear treatment is carried out, only the insufficient roughened surface is obtained. On the other hand, in the embodiment according to the invention, the support formed of a metal which can easily be subjected to the roughening treatment is used to carry out the roughening treatment over the support and to then transfer the surface shape of the roughened surface of the support onto the insulating layer and the solder resist layer. Irrespective of a material by which the semiconductor device mounting surface is formed, accordingly, the roughening can be performed well.

A general line for manufacturing the wiring board is provided with an etching device, an oxidizing (blackening) device and a plating device. In the invention, it is possible to carry out the roughening treatment for the support by utilizing the existing devices. Therefore, a new capital investment is not required so that a transition to execution is easy.

While the embodiments according to the invention have been described above with reference to the accompanying drawings, the invention is not restricted to the embodiments but various configurations, changes and modifications can be made without departing from the spirit or scope of the invention.

For example, in the embodiments according to the invention, there has been described only a wiring board (a semiconductor package) of an LGA (Land Grid Array) type in which a connecting pad itself exposed to an external connecting terminal surface serves as an external connecting terminal. It is a matter of course that the invention can also be applied to a wiring board (a semiconductor package) of a BGA (Ball Grid Array) type in which a solder ball is bonded to a connecting pad exposed to an external connecting terminal surface or a PGA (Pin Grid Array) type in which a pin is bonded to a connecting pad exposed to an external connecting terminal surface.

For example, the wiring board according to the second embodiment shown in FIGS. 6 to 8B, it is a matter of course that an insulating layer and a wiring layer may be formed as a multilayer to obtain a multilayer wiring board. In the semiconductor apparatus according to the second embodiment, moreover, the semiconductor device may be provided on the wiring board through the flip-chip bonding. In the second embodiment, particularly, it is also possible to employ a structure including the step in FIG. 9E and a structure in which the roughening treatment for the support is carried out after the formation of the connecting pad as shown in FIG. 12E as described in the third or fourth embodiment.

Although the copper foil or the copper plate is used as the support in the embodiments, moreover, it is also possible to use a stainless or aluminum foil or plate in addition to the materials.

As described above, according to the invention, there is included the step of carrying out the roughening treatment over the surface of the support. Therefore, the surface of the support subjected to the roughening treatment is transferred onto the insulating layer or the solder resist layer which serves as the semiconductor device mounting surface. Accordingly, there is carried out a regulation into a state in which a high wettability is obtained together with the underfill resin in the process for manufacturing a semiconductor apparatus. Consequently, it is possible to control a flowability of the underfill resin when filling the underfill resin, thereby preventing a void from being generated. Moreover, an adhesion between the support and the insulating layer or the solder resist during the manufacture can be enhanced. Consequently, it is possible to prevent the generation of a drawback that the support and the wiring board are suddenly peeled in the manufacture. Accordingly, quality can be enhanced and the invention can be widely applied as a wiring board or a semiconductor apparatus having the feature, for example, a semiconductor package including an MPU, a chip set and a memory or a coreless package such as a DLL3.

What is claimed is:

1. A wiring board comprising:
  a dielectric layer;
  a wiring layer; and
  a connecting pad having a first surface exposed from the dielectric layer and a second surface opposite to the first surface, the second surface being in contact with the dielectric layer and being formed as a roughened surface;
  wherein one surface of said wiring board serves as a semiconductor device mounting surface and the other surface which is opposed to the surface of said wiring board serves as an external connecting terminal surface, and
  wherein a surface of the dielectric layer is the semiconductor device mounting surface and is formed as a roughened surface.

2. The wiring board according to claim 1, wherein the dielectric layer is an insulating layer or a solder resist layer.

3. The wiring board according to claim 1, wherein a roughness degree of the roughened surface is in a range of 300 nm $\leq$ Ra $\leq$ 800 nm and 3.5 µm $\leq$ Rz $\leq$ 7 µm, wherein Ra is the arithmetic mean roughness and Rz is the maximum height of irregularities.

4. A semiconductor apparatus comprising:
  the wiring board according to claim 1;
  a semiconductor device mounted on the semiconductor device mounting surface of the wiring board through a flip-chip bonding; and
  an underfill resin filled between the semiconductor device and the semiconductor device mounting surface.

5. The wiring board according to claim 1, wherein the connecting pad is embedded in the dielectric layer and a side surface of the connecting pad is formed as a roughened surface.

6. The wiring board according to claim 1, wherein an end portion of a via of the wiring layer is connected to the surface of the connecting pad which is in contact with the dielectric layer.

7. The wiring board according to claim 1, wherein a via hole having a bottom surface corresponding to the roughened surface of the connecting pad is formed in the dielectric layer, the via hole has a truncated cone shape such that an area at an opening side is larger than an area of the bottom surface side, and a via which is connected to the roughened surface of the connection pad is provided in the via hole.

8. The wiring board according to claim 7, wherein a metal layer is formed in the via hole and over a surface of the dielectric layer, and the wiring layer and the via is formed by the metal layer.

9. The wiring board according to claim 1, wherein the connection pad is formed by stacking any of the following metal layers in an order from the first surface of the connection pad exposed from the dielectric layer: Au/Ni, Au/Ni/Cu, Au/Pd/Ni/Cu, or Ni/Cu.

10. The wiring board according to claim 1, further comprising:
  wiring layers and insulating layers stacked in a multilayered structure on the dielectric layer.

11. The wiring board according to claim 10, wherein the dielectric layer and the insulating layers are made of resin, and the connection pad and wiring layers are made of plating metal.

* * * * *